United States Patent [19]

Ina et al.

[11] Patent Number: 4,669,883

[45] Date of Patent: Jun. 2, 1987

[54] METHOD AND APPARATUS FOR ALIGNMENT

[75] Inventors: Hideki Ina; Hiroshi Shinkai, both of Yokohama, Japan

[73] Assignee: Canon Kabushiki Kaisha, Tokyo, Japan

[21] Appl. No.: 589,341

[22] Filed: Mar. 14, 1984

[30] Foreign Application Priority Data

Mar. 22, 1983 [JP] Japan ................................ 58-48091

[51] Int. Cl.$^4$ ............................................. G01B 11/00
[52] U.S. Cl. .................................... 356/401; 250/548; 356/400
[58] Field of Search ................ 250/548, 557; 356/399, 356/400, 401

[56] References Cited

U.S. PATENT DOCUMENTS

| 4,199,219 | 4/1980 | Suzki et al. ........................... 350/6.8 |
| 4,277,178 | 7/1981 | Cushing et al. ....................... 356/431 |
| 4,423,959 | 1/1984 | Nakazawa et al. .................... 356/400 |
| 4,515,481 | 5/1985 | Yamada et al. ....................... 356/401 |
| 4,531,060 | 7/1985 | Suwa et al. ........................... 250/557 |

Primary Examiner—F. L. Evans
Attorney, Agent, or Firm—Fitzpatrick, Cella, Harper & Scinto

[57] ABSTRACT

A method and apparatus for aligns two members each having an alignment mark which has mark elements extending in different directions. The marks are scanned with two linear illumination areas which are spaced apart by a predetermined distance and extend in different directions.

8 Claims, 18 Drawing Figures

METHOD AND APPARATUS FOR ALIGNMENT

BACKGROUND OF THE INVENTION

1. Field of the Invention

This invention relates to method and apparatus for alignment of members, and more particularly to the method and apparatus for aligning a photomask (hereinafter called "mask") and a wafer in semiconductor circuit pattern exposure.

2. Description of the Prior Art

Conventionally, it is known to scan alignment marks provided on a mask and wafer, respectively, with a laser beam condensed as a spot, when the mask and wafer are to be aligned with each other in the semiconductor circuit pattern exposure operation, as disclosed in Japanese Laid-Open Patent Application No. 90872/1983 and others. FIG. 1 shows one of alignment marks provided on the mask or wafer. In this Figure, designated by reference characters M1, M2, M1' and M2' are the mark elements forming the alignment mark on the mask, and among those the mark elements M1 and M2 are inclined at the same angle with respect to the beam scanning line L, while the mark elements M1' and M2' are inclined oppositely but at the same angle. The angle between the mark elements M1 and M2', and the angle between the mark elements M2 and M1' are the same, for example, 90 degrees.

On the other hand, designated by reference character W1 and W1' are mark elements forming the alignment mark on the wafer. The angle between the mark elements W1 and the mark elements W1' is the same as the angle between the mark elements M1 and M2'. Therefore, when the mask and wafer are aligned, the mark element W1 extends parallel to the mark elements M1 and M2, while the mark element W1' is parallel to the M1' and M2', and in addition, the intervals therebetween are the same. The scanning beam is diffracted by the edges of the mark elements, but the optical system includes means for spatial frequency filtering on the Fourier transform plane with respect to the mask and wafer to block the light other than the signal light. By this function, a photoelectric detector only receives the diffracted light from the alignment marks, and therefore, produces a series of good signals.

A signal processing system processes the signal to determine the displacement between the mask and wafer in X, Y and $\theta$ directions. In accordance with the determination, the wafer or the mask is moved to correctly align them. However, when the marks are scanned by a spot-like beam, the detection may be significantly affected by dust possibly existing in the optical system, a score in the optical elements in the system or the like. Additionally, when there is a piece of dust or something like that on the scanning line, as shown by reference numeral 8 in FIG. 1, or when a part of the alignment mark is missing, the alignment is achieved only with lower precision or cannot be achieved at all.

Further, when the surface to be scanned is rough, such as a rough aluminum surface, the beam is reflected and scattered by the portions other than the mark portions, and this scattered light is not filtered out and reaches the photoelectric detector as noise so that the alignment operation is sometimes disabled. To obviate the problems, the Applicant of the present application has proposed, in Japanese Patent Application No. 181315/1981, that the alignment marks are scanned by a sheet-like beam (a beam which forms a thin and elongated illumination area on the surface to be scanned). The broad area, provided by the sheet-like beam, with which the marks are scanned, is effective to significantly reduce the influence of dust 8 on the scanning line or the defects of the alignment marks 9.

FIGS. 2 and 3 show the configuration of the filter for effecting the spatial frequency filtering on the Fourier transform plane with respect to the surface to be scanned. FIGS. 2 and 3 show the configurations for the spot-like beam and sheet-like beam, respectively. When the illumination area of the beam on the surface to be scanned extends in the direction perpendicular to the direction of scan, the diffracted light which has been diffracted by the edge portion of the alignment mark, i.e., the signal light, forms a spectrum distribution concentrated in a narrow area at the Fourier transform plane. And, it is possible to narrow the transparent part 7 of the filter as shown in FIG. 3. On the other hand, the randomly scattered light which is the noise component is incident over the entire surface of the filter. Thus, the influence of the ghost and the flare caused by the structure of the optical system, or the noise component resulting from the randomly scattered light from the wafer having a rough surface can be avoided without decreasing the amount of signal light so that a signal detection with good signal-to-noise ratio can be provided. It will be understood that the use of the sheet-like beam provides advantages more than those provided by the aggregation effect by enlargement of the beam.

Furthermore, Japanese Patent Application No. 208764/1982 proposes that sheet-like beams crossed at their inclination to meet the angle between the mark elements be used for the scan of the alignment marks. However, in one of the embodiments disclosed in the Application, the sheet-like beams are made to have different polarizations for the discrimination of the alignment marks having different inclination, which results in less latitude of design.

SUMMARY OF THE INVENTION

It is an object of the present invention to provide a method and apparatus wherein the influence of foreign matter or other defects is mitigated during the scan of the alignment marks.

Another object of the present invention is to provide a method and apparatus wherein the high accuracy and high speed alignment processing is made possible by removing a possibly unstable factor such as driving for changing the inclination of the sheet-like beam.

These and other objects, features and advantages of the present invention will become more apparent upon a consideration of the following description of the preferred embodiment of the present invention taken in conjunction with the accompanying drawings.

According to an embodiment of the present invention which will be described hereinafter, those objects of the present invention are achieved by scanning the alignment marks of two members, each of which marks have mark elements extending at a predetermined angle, with plural sheet-like beams of different inclination separated by a predetermined interval.

DESCRIPTION OF THE PREFERRED EMBODIMENT

The present invention will now be described in conjunction with the drawings.

Figure 1:
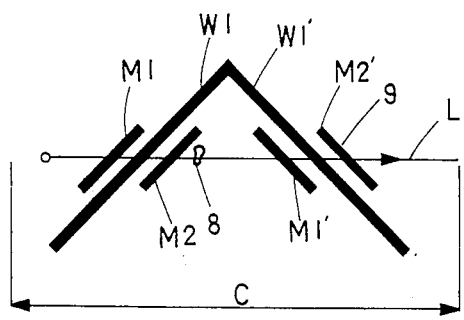
FIG. 1 shows an arrangement of a conventional apparatus.
Figure 2:
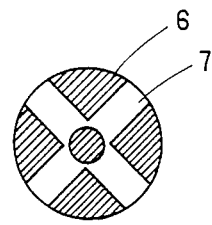
FIGS. 2 and 3 show front views of filters.
Figure 3:
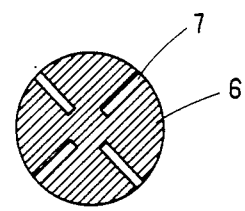
Figure 4:
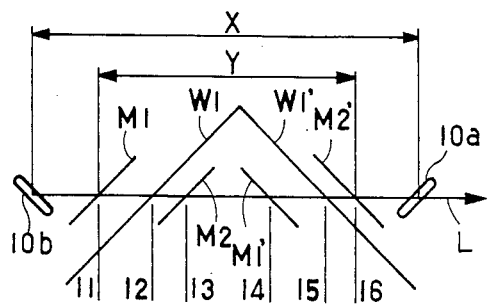
FIG. 4 illustrates optical action of an embodiment of the present invention.

In FIG. 4, reference characters M1, M2, M1' and M2' depict mark elements, which are thinner than conventional ones, constituting an alignment mark on the mask. The mark elements M1 and M2' inclined with respect to each other at an angle which is the same as the angle formed between the mark elements M2 and M1', for example, 90 degrees. The mark elements M1 and M2 are parallel. Designated by reference characters W1 and W1' are mark elements constituting an alignment mark on the wafer and they are at an angle equal to the angle between the mark elements of the mask. FIG. 4 shows only one of the patterns of the mask or wafer, and actually there are several patterns at the opposite side with respect to the center thereof. The patterns of the mask and wafer alignment marks may be interchanged. A line L is a scanning line provided by driving a polygonal mirror which will be described in detail hereinafter. Reference numerals 10a and 10b depict linear areas illuminated by sheet-like beams at a certain instance during a scanning operation. The sheet-like beams will be called by the same reference numerals. The sheet-like beam is produced in the manner which will be described in detail hereinafter. The sheet-like or bar-like beam for the first illumination area 10a forms an illumination area parallel to the mark elements M1, W1 and M2, while the sheet-like beams 10b forms an illumination area parallel to the mark elements M1', W1' and M2'. Those two illumination areas 10a and 10b are spaced by the interval X in the direction of the scanning line L. The interval X is longer than the interval Y between the outermost mark elements M1 and M2'. The long separation between the sheet-like beams is effective to avoid the occurrence that one of the sheet-like beams becomes noise with respect to the other, and is further effective to discriminate the orientation of the mark elements.

The electric signals which have been produced when the two sheet-like beams, spaced by the distance X on the surface to be scanned, scans the alignment marks simultaneously, and which have been filtered, will be described hereinafter.

FIG. 5(a) shows the filtered electric signals (alignment signals) when only the first sheet-like beam 10a scans the alignment marks of FIG. 4. Three high peak signals 11, 12 and 13 appear corresponding respectively to the mark elements M1, W1 and M2 which are parallel to the beam 10a, and then there appear low peaks 14, 15 and 16 corresponding respectively to the mark elements M1', W1' and M2' which extend perpendicularly to the sheet-like beam 10a. The latter peak signals are low in height but wide in term length because they are produced when the sheetlike beam passes over the orthogonal mark elements. Those signals will be hereinafter called non-aimed signals.

FIG. 5(b) shows alignment signals produced when only the second sheet-like beam scans the alignment marks. Low peak non-aimed signals 17, 18 and 19 are produced from the mark elements M1, W1 and M2, while high peak signals 20, 21 and 22 are produced from the mark elements M1', W1' and M2'.

Since the first and second sheet-like beams 10a and 10b scan the alignment marks under the condition that they are being spatially separated, there is a time lag between the production of the signal 16 and that of the signal 17.

FIG. 5(c) shows the alignment signals produced when the first and second sheet-like beams scan. The peaks 11–22 correspond to the peaks of FIGS. 5(a) and 5(b). Since two beams pass, two groups of outputs are produced by one set of alignment marks. The time lag therebetween is converted to a spatial interval equal to the length X between the two illumination areas. In other words, the distance between the signals 11 and 17 in FIG. 5(c) corresponds to X.

Assuming that X is zero, the high peak signals and the low signals are superposed unlike FIGS. 5(a)–5(c), as shown in FIG. 5(d), so that the resulting signals are dull with wider roots, and therefore, the final signals to be processed are deformed.

The factors which can degrade the accuracy of alignment can be excluded by suitably selecting the value of X in relation to the width Y of the alignment marks to avoid the influence of the non-aimed signals 14–19 to the high peak signals 11–13 and 20–22.

Figure 5:
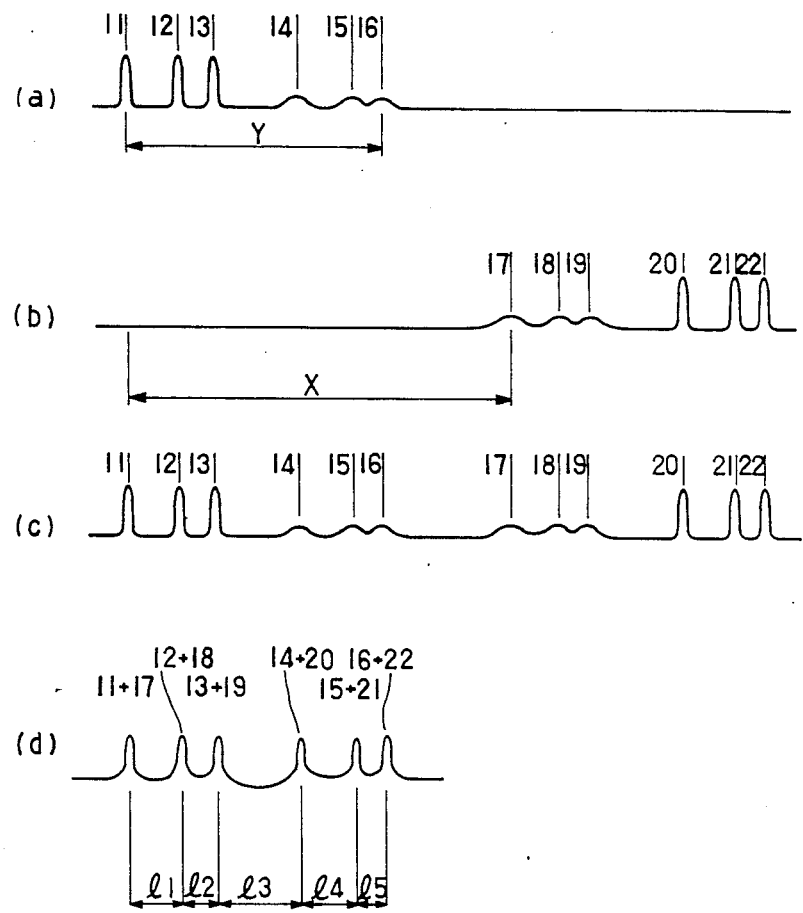
FIGS. 5(a) to 5(d), show the forms of electric signals.

To obtain the displacement between the mask and wafer with the use of the alignment marks shown in FIG. 4, only the intervals 11, 12, 14 and 15 are used among the intervals 11–15 of FIG. 5. It is not necessary to use the interval 13. Therefore, it is enough to measure the time intervals among the high peak signals 11, 12 and 13, and the time intervals among the high peak signals 20, 21 and 22 of FIG. 5(c) in order to obtain the displacement necessary to achieve alignment.

Heretofore, description has been made as the interval X between the sheet-like beams being larger than the width Y of the alignment marks. However, the interval X may be of another value if the non-aimed signals do not mix with the high peak signals at the time of the completion of the alignment. In another embodiment of the present invention which will be described hereinafter, the interval X is slightly larger than Y/2.

Figure 6:
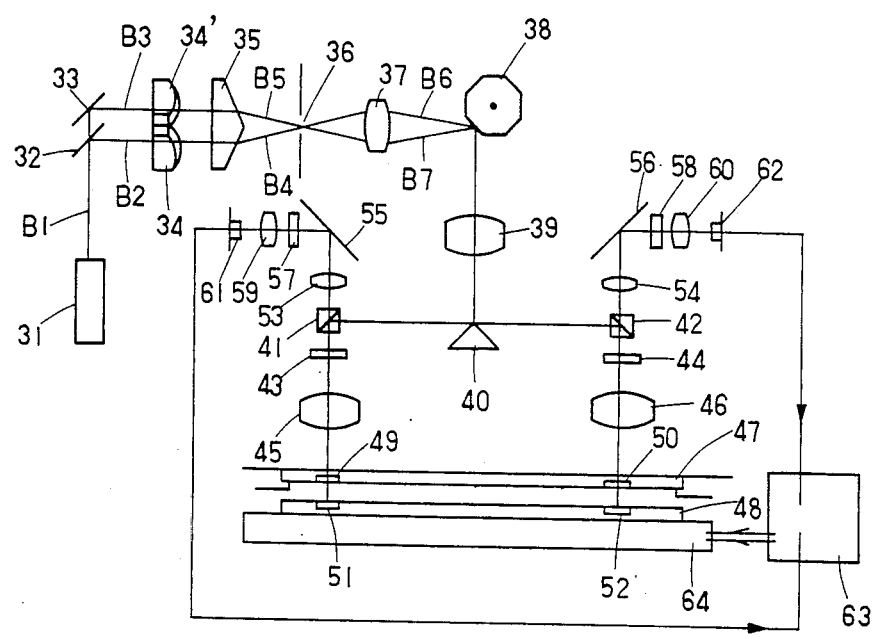
FIG. 6 shows the optical arrangement of an embodiment according to the present invention.

FIG. 6 shows an optical system for a so-called proximity method of alignment which incorporates an optical system for producing the sheet-like beams which have different inclinations.

In this Figure, a linearly polarized laser beam B1 produced by a laser source 31 is divided by a half-mirror 32 into two beams, i.e., a reflected beam B2 and a transmitted beam B3 which is then reflected by a mirror 33. The beams B2 and B3 are directed to positive power cylindrical lenses 34 and 34', which produce the generated lines or sheet-like beams forming an angle equal to that between the above-described mark elements. The generating lines are so arranged that, if they were projected onto the surface to be scanned, they would be parallel to the mark elements. Therefore, the generating lines are 45 degrees with respect to the surface of the drawing. The beams emergent from the cylindrical lenses 34 and 34' are introduced to a prism 35 having two inclined surfaces and refracted inwardly to be combined with each other at the pupil 36 (aperture stop) of a condensing lens 37 (beams B4 and B5). That is, the center lines of the beams B4 and B5 are crossed with each other at the pupil. The position of the pupil 36 is on the focal points of the cylindrical lenses 34 and 34', so that the crossed sheet-like beams are already formed there.

Figure 7A:
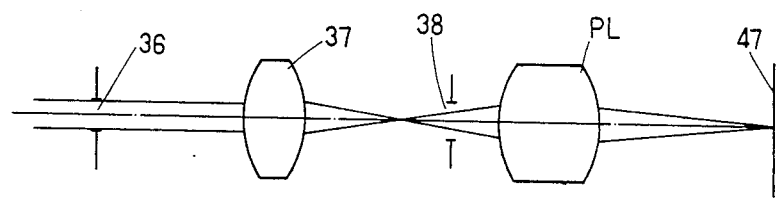
FIGS. 7A, 7B and 8 are cross-sections of a part of the optical system.
Figure 7B:
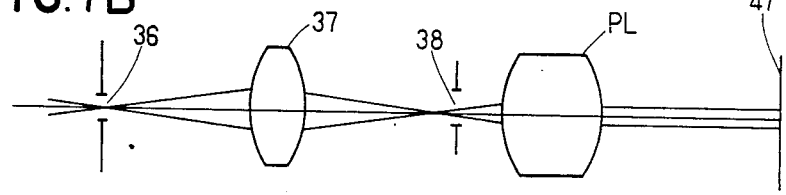

FIG. 7A shows the optical actions of the cylindrical lenses 34 and 34' in the plane including the generating lines. In this direction, the cylindrical lenses do not have power so that the laser beams do not condense on the pupil 36. On the other hand, FIG. 7B shows the optical actions in the plane perpendicular to the generating lines, where the beams are once condensed on the pupil 36. In these Figures, designated by reference numeral 38 is the point of reflection of the beam scanning reflection polygonal mirror, which is schematically shown as an aperture; PL designates the subsequent lens system; and 47 is the surface to be scanned, for example, a mask. The point of reflection of the polygonal mirror hardly moves when the mirror rotates. For this reason, in designing the scanning optical system, the point of reflection is deemed as an aperture.

As shown in FIGS. 7A and 7B, the state of the beam imaged on the surface 47 to be scanned corresponds to that shown in FIG. 7A so that it does not image on the surface to be scanned. The state of the beam determining the length of the sheet-like beam corresponds to that shown in FIG. 7B.

Figure 8:
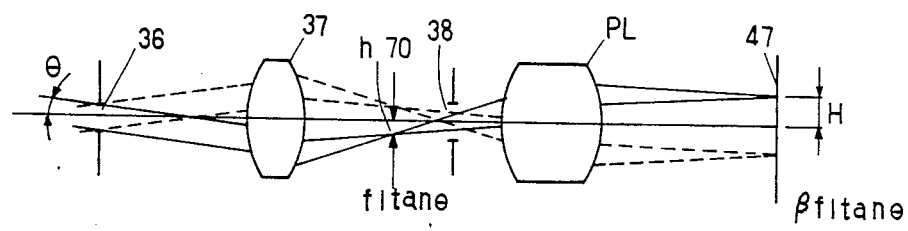

Now, FIG. 8 will be described. As described hereinbefore, in the plane including the generating lines, the laser beam is incident on the prism 35 without receiving the condensing action of the cylindrical lens, and it is incident on the condensing lens 37 as a parallel beam refracted by the angle $\theta$ and images on the focal point 70 of the condensing lens. The image height is $f1 \tan\theta$, where $f1$ is the focal length of the condensing lens. The image is reimaged on the surface to be scanned 47 by the lens system PL. The image height on the surface to be scanned in $\beta \cdot f1 \cdot \tan\theta$, where the image magnification of the lens system is $\beta$. The beam incident at an angle $-\theta$ condense on the point (top of the image) of $-\beta \cdot f1 \cdot \tan\theta$ so that distance between the condensing points is $2\beta \cdot f1 \cdot \tan\theta$. Thus, the interval shown by X in FIG. 4 is represented by $2\beta \cdot f1 \cdot \tan\theta$. By suitably selecting $\beta$, $f1$ and $\theta$, it may be as desired.

In the direction in which the beam is condensed by the cylindrical lens, as shown in FIG. 7B, the pupil at which the beam is condensed is in imaging relation with the reflecting point 38 of the polygonal mirror so that the surface 47 to be scanned is illuminated with the beam parallel with the optical axis by making a telecentric arrangement of the emergent side of the lens system PL. The width of the parallel beam determines the length of the illuminating area of the sheet-like beam.

Now, returning to FIG. 6, the beam once imaged in the sheet form passes through the condensing lens 37 and is reflected by the polygonal mirror 38 rotating at a constant speed, and then is introduced to an $f-\theta$ lens 39. The beam emergent from the $f-\theta$ lens 39 is incident on a Dach prism 40 having reflecting surfaces which merge at its apex, where the beam is split. Since the apex is on the optical axis, the first half of one scan covers the left half field, and the subsequent half covers the right half field. The beam reflected by the Dach prism 40 reaches polarization beam splitters 41 and 42, where the beams are reflected, since the polarization of the beam is so determined. Linearly polarized beams reflected by the polarization beam splitters 41 and 42 are converted to circularly polarized beams by $\frac{1}{4}\lambda$ plates 43 and 44. The two circularly polarized beams are imaged, in the form of separate strips, on the mask 47 and the wafer 48 adjacent thereto.

The alignment marks 49 and 51, and the alignment marks 50 and 52 are scanned in sequence by the sheet-like beam. The signal light which has been reflected by the edges of the marks and the noise light of the mask and wafer are condensed by the objective lenses 45 and 46, and then pass again the $\frac{1}{4}\lambda$ plates 43 and 44 so that their direction of polarization is changed by 90 degrees. Therefore, the lights can pass through the polarization beam splitter 41 and be 42 and filtered by the spatial frequency filters 57 and 58 which are placed at a position conjugate with the pupils of the objective lenses 45 and 46. By this filtering, the noise light is blocked, so that only the signal lights are condensed on photoelectric transducers 61 and 62 by positive lenses 59 and 60. The spatial frequency filters 57 and 58 are disposed conjugate with the point 38 of reflection of the polygonal mirror and also with the pupil 36, so that, on the filters, the sheet-like beams are imaged.

The series of the signals produced by the photoelectric transducers 61 and 62 are introduced into an alignment signal processing circuit, such as a microprocessor 63, where a predetermined processing is executed. The results are used to move the wafer stages 64 in the linear directions x and y and the rotational direction $\theta$, so as to bring the mask 47 and wafer 48 into alignment.

The foregoing description has been made on the assumption that the wafer mark element W1 is between the mask mark elements M1 and M2. A worse state of alignment has previously been removed by a prealignment which can be effected, for example, mechanically.

Even if, however, the prealignment is not with suitable precision, for example, even if the wafer mark element W1 is not between the mask mark elements M1 and M2, the present invention works correctly.

Figure 9:
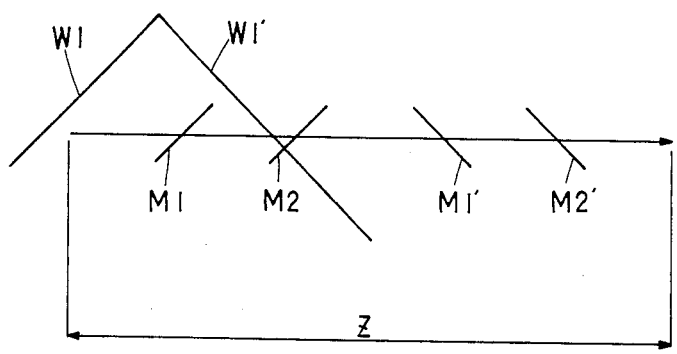
FIGS. 9 and 10 show the alignment marks before alignment.
Figure 10:
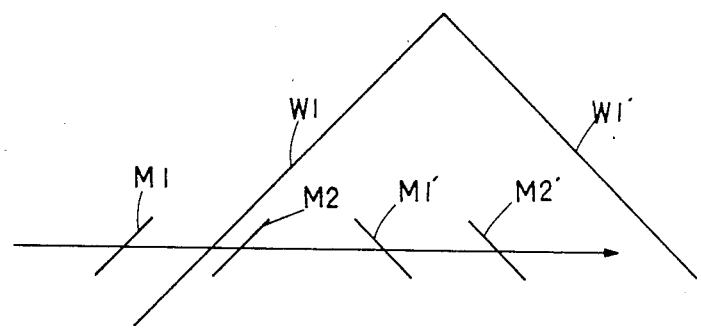
Figure 11:
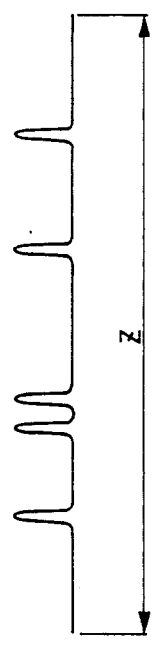
FIGS. 11, 12 and 13 show forms of electric signals.

The width of scan of the laser beam is generally determined by the effective area limited by the view field of the objective lens. In FIG. 9, the ordinarily used area therewithin is shown by the reference character z. When the prealignment is not precise, it can occur that only one of the wafer marks is within the scanning range of the laser. In this case, a program is used to move the wafer in a trial and error manner, so as to bring the alignment marks into the scanning range. However, even if all the alignment marks are within the scanning range, the conventional scan using the spot-like beam possibly does not detect this situation of misalignment of the mask and wafer. For example, the signals are the same, such as shown in FIG. 11, both when the marks are as shown in FIG. 9 and FIG. 10. Therefore, time is required until the mask and wafer are put into the prealignment position prepared for the correct measurement.

Figure 12:
Figure 13:
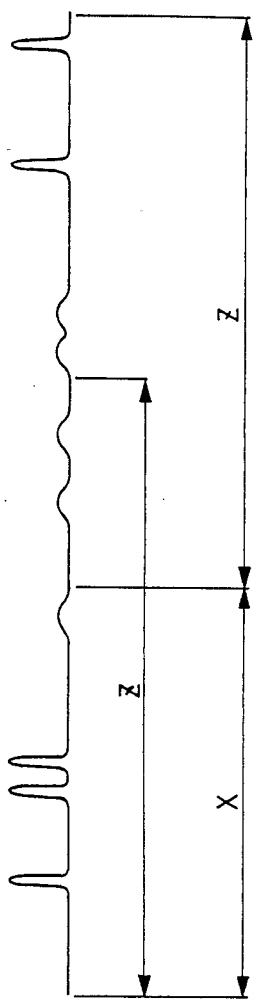

According to the present invention, the alignment signals for the situation shown in FIG. 9 are as shown in FIG. 12, and the alignment signals for the situation shown in FIG. 10 are as shown in FIG. 13, so that they can be distinguished. In these examples Z>X. However, if X>Z, the alignment signals produced by the sheet-like beam extending from upper right to bottom left first appear, and then the alignment signals by the sheet-like beam extending from upper left to bottom right appear. So, the directions of the mark elements can be simply determined. Thus, a highly precise alignment can be achieved even if the prealignment was not precise.

The foregoing examples have been shown as a mask aligner wherein the mask and the wafer are contacted or placed in proximity with each other when exposed, but they can be applied to the case where the mask is optically projected on the wafer.

Figure 14:
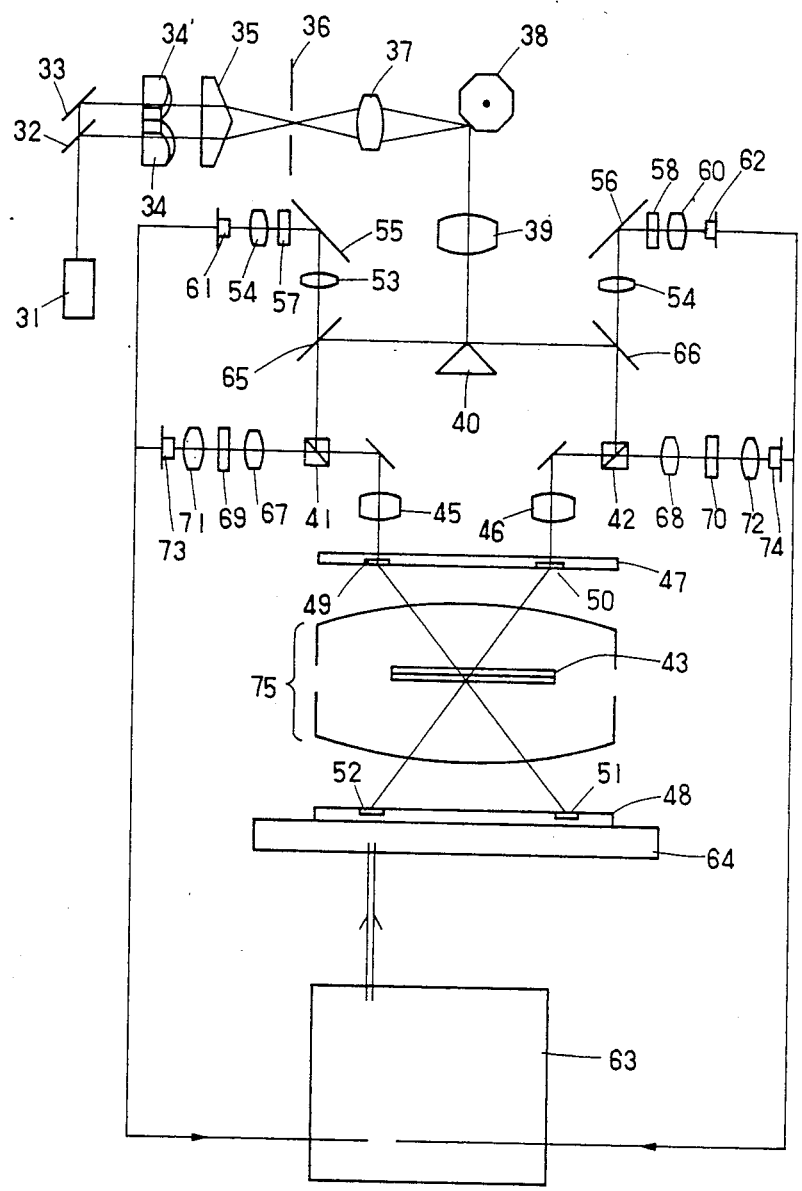
FIG. 14 shows an optical arrangement of another embodiment according to the present invention.

In FIG. 14, reference numberal 75 is an imaging lens for real size or reduction projection, with respect to which the mask and the wafer are optically conjugate. Designated by 43 is $\frac{1}{4}\lambda$ plate disposed between the mask and wafer, preferably in an afocal path within the lens system 75. Designated by reference numerals 65 and 66 are half-mirrors; 41 and 42, polarization beam splitters; 67, 68, 71 and 72, positive power lenses; and 69 and 70, spatial frequency filters. The same reference numerals are assigned for the elements equivalent to those in FIG. 6.

The $\frac{1}{4}\lambda$ plate is placed between the mask 47 and the wafer 48, because the polarization of the signal light from the mask 47 and the polarization of the signal light from the wafer 48 are made different to make them distinguishable, so that a noise by stray light can be removed.

Up to the point where the beams are condensed on the mask 47 as a sheet-like beam by the objective lens, the explanation with respect to FIG. 6 applies. The sheet-like beam having passed through the mask 47 is condensed again on the wafer 48 to scan the same. In this embodiment, the mask 47 is scanned by the sheet-like beams which are reflected by the beam splitters 41 and 42, and have the linear polarization characteristics, while the wafer 48 is scanned by the sheet-like beams which are obtained by converting the polarization state into a circularly polarized state by the $\frac{1}{4}\lambda$ plate. The beam reflected by the wafer 48 is passed again through the $\frac{1}{4}\lambda$ plate 43 and converted in its state of polarization into the linearly polarized state whose plane of polarization is changed by 90 degrees as compared with the state upon incidence. Therefore, it can be distinguished from the beam reflected by the mask 47. The signal lights from the alignment marks 49 and 50 of the mask are received by the photoelectric transducers 61 and 62, while the signal lights from the alignment marks 51 and 52 of the wafer are received by the photoelectric transducers 73 and 74. The alignment signals from the photoelectric transducers 61 and 73 are electrically combined, and also the alignment signals from the photoelectric transducers 62 and 74 are combined, then they are transmitted to the processing circuit 63, where the combined signals are processed, whereafter the position of the stage 64 or the chuck supporting the mask 64 is adjusted.

Figure 15:
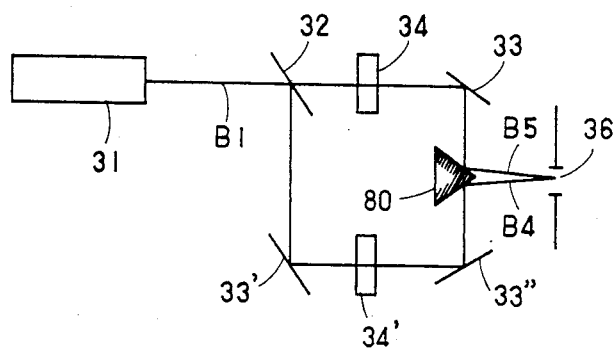
FIG. 15 shows a modified part of the optical system.

In FIG. 6 arrangement, the refraction is used in order to incline the beam, having passed through the cylindrical lenses 34 and 34' with respect to the pupil 36 by the angle $\theta$. It is possible, however, to use reflection as shown in FIG. 15. The beams emergent from the cylindrical lenses 34 and 34' are reflected by reflecting mirrors 33 and 33", and then reflected by a Dach prism 80 which has been subjected to reflecting treatment so that they are inclined by the predetermined angle $\theta$, and thereafter, they are incident on the pupil 36.

Figure 16:
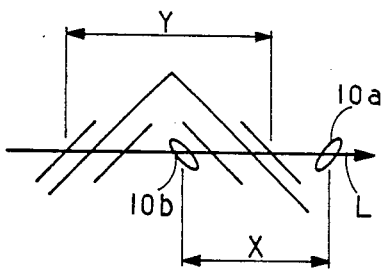
FIG. 16 shows an optical action of a further embodiment.
Figure 17:
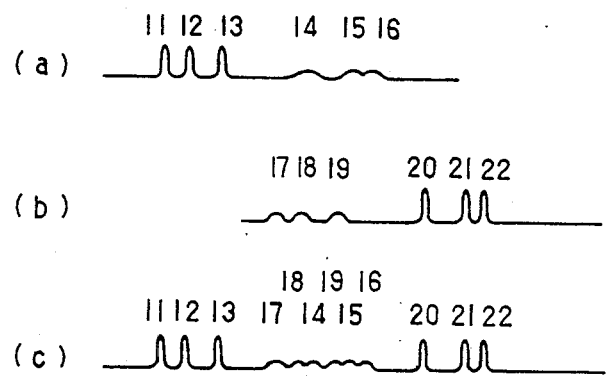
FIGS. 17(a), 17(b) and 17(c) show forms of electric signals.

In FIG. 4, the interval X between the sheet-like beams measured on the surface to be scanned is greater than the width Y of the alignment mark. However, what is required is that, when the final alignment is achieved, the alignment signals do not contain non-aimed signals. Therefore, the arrangement shown in FIG. 16 is possible, wherein $Y>X>Y/2$. FIG. 17(a) shows the alignment signal from the first illumination area 10a; FIG. 17(b), the signal from the second illumination area 10b; FIG. 17(c), the alignment signal when the illumination areas 10a and 10b are both used. The alignment signals having high peaks 11, 12 and 13 and also 20, 21 and 22 are not influenced by the non-aimed signals, so that higher accuracy measurement in possible as compared with conventional systems. This is particularly effective when the sheet-like beams cannot be spaced apart by a large distance due to some limitation to the apparatus.

The beam source is not limited to a laser, to light having the visible wavelength or to the invisible wavelength light. When the alignment mark is constituted by more than 2 mark elements having different inclinations, the corresponding number of sheet-like beams are used.

The advantageous effects of the present invention have been described in conjunction with FIG. 9. In addition to those, high accuracy and high speed alignment is achieved since the signal does not contain the non-aimed signal component. Further, since there is no mechanical switching used, the performance of the optical systems is stable, the controlling systems are simplified, and the assembly, adjustment and maintenance are made less expensive.

What is claimed is:

1. An apparatus for aligning objects having respective marks each having portions extending in different directions at a predetermined angle, comprising:
    means for producing a plurality of beams each having a bar-like cross-section with the cross-sections of the beams extending in different directions at the predetermined angle;
    means, having a pupil, for effecting a scan of the marks along at least one scanning line with the beams entering the pupil to produce mark signals wherein the cross-sections of the beams extend substantially co-directionally with corresponding portions of the marks;
    means for crossing the beams at the pupil to provide an interval between the beams on the scanning line; and
    means for aligning the objects using the mark signals provided by scanning the marks with said scanning means.

2. An apparatus according to claim 1, wherein said producing means produces a laser beam.

3. An apparatus according to claim 1, wherein said producing means includes a beam source for producing a laser beam, a beam splitter for dividing the laser beam into the plurality of beams and a cylindrical lens provided for each of the respective beams, said cylindrical lenses having respective generating lines inclined differently.

4. An apparatus according to claim 1, wherein said scanning means includes a deflecting mirror system and a lens system, the pupil of said lens system and a point of reflection of the beam by said mirror system being optically conjugate.

5. An apparatus according to claim 4, wherein said mirror system includes a polygonal mirror rotatable at a constant rotational speed.

6. An apparatus according to claim 1, wherein said means for crossing the beams introduces the beams into the pupil with respective predetermined inclinations.

7. An apparatus according to claim 1, wherein said means for crossing the beams includes a prism having plural inclined surfaces.

8. A method of aligning objects having respective marks each having portions extending in different directions at a predetermined angle, said method comprising the steps of:

producing a plurality of beams each having a bar-like cross section with the cross sections of the beams extending in different directions at the predetermined angle, the cross sections of the beams extending substantially co-directionally with corresponding portions of the marks;

scanning the marks along at least one scanning line with said beams entering a pupil to produce mark signals;

crossing the beams at the pupil to provide an interval between the beams on the scanning line; and aligning the objects using the mark signals provided by scanning the marks by said scanning step.

* * * * *

UNITED STATES PATENT AND TRADEMARK OFFICE
CERTIFICATE OF CORRECTION

PATENT NO. : 4,669,883          Page 1 of 2
DATED : June 2, 1987
INVENTOR(S) : HIDEKI INA, ET AL.

It is certified that error appears in the above-identified patent and that said Letters Patent is hereby corrected as shown below:

AT [57] IN THE ABSTRACT

Line 1,   "for" should be deleted.

COLUMN 1

Line 37,  "M1'" should read --mark elements M1'--.

COLUMN 3

Line 3,   "5(d), show" should read --5(d) show--.
    Line 26,  "M2' inclined" should read --M2' are inclined--.
    Line 48,  "beams" should read --beam--.
    Line 60,  "scans" should read --scan--.

COLUMN 5

Line 46,  "beam" should read --beams--.
    Line 48,  "that distance" should read --that the distance--.
    Line 62,  "sheet" should read --sheet-like--.

COLUMN 6

Line 33,  "stages" should read --stage--.

COLUMN 7

Line 16,  "is" should read --is a--.
    Line 28,  "a" should be deleted.
    Line 57,  "mask 64" should read --mask 47--.

UNITED STATES PATENT AND TRADEMARK OFFICE
CERTIFICATE OF CORRECTION

PATENT NO. : 4,669,883  Page 2 of 2
DATED : June 2, 1987
INVENTOR(S) : HIDEKI INA, ET AL.

It is certified that error appears in the above-identified patent and that said Letters Patent is hereby corrected as shown below:

COLUMN 10

Line 2,  "cross section" should read --cross-section--.
Line 2,  "cross sections" should read --cross-sections--.
Line 4,  "cross sections" should read --cross-sections--.

Signed and Sealed this

Twenty-fourth Day of November, 1987

Attest:

DONALD J. QUIGG

*Attesting Officer*   *Commissioner of Patents and Trademarks*